United States Patent [19]

Mauch et al.

[11] Patent Number: 4,834,615
[45] Date of Patent: May 30, 1989

[54] MOUNTING ARRANGEMENT FOR AN AXIAL FAN

[75] Inventors: Richard Mauch, Eggenstein-Leopoldshafen; Klaus Klein, Rheinstetten, both of Fed. Rep. of Germany

[73] Assignee: Siemens Aktiengesellschaft, Berlin and Munich, Fed. Rep. of Germany

[21] Appl. No.: 164,601

[22] Filed: Mar. 7, 1988

[30] Foreign Application Priority Data

Jun. 4, 1987 [DE] Fed. Rep. of Germany ... 8707975[U]

[51] Int. Cl.⁴ .......................................... F04D 29/52
[52] U.S. Cl. ................................................. 415/213.1
[58] Field of Search .............. 415/201, 213 C, 219 R, 415/219 C

[56] References Cited

U.S. PATENT DOCUMENTS

| | | | |
|---|---|---|---|
| 2,650,021 | 8/1953 | Morrill | 415/219 R |
| 4,073,597 | 2/1978 | Barnhart et al. | 415/201 |
| 4,327,398 | 4/1982 | Christison | 361/384 |
| 4,353,680 | 10/1982 | Hiroaka et al. | 415/219 R |
| 4,517,880 | 5/1985 | Buckner et al. | 98/1 |
| 4,599,042 | 7/1986 | Colliver | 415/219 R |
| 4,710,096 | 12/1987 | Erlam | 415/219 R X |
| 4,741,669 | 5/1988 | Shimokawabe | 415/213 C |

FOREIGN PATENT DOCUMENTS

| | | |
|---|---|---|
| 0135845 | 8/1984 | European Pat. Off. . |
| 8234056 | 12/1982 | Fed. Rep. of Germany . |
| 2047806 | 12/1980 | United Kingdom ............ 415/219 R |
| 2107787 | 5/1983 | United Kingdom . |

Primary Examiner—Robert E. Garrett
Assistant Examiner—Joseph M. Pitko
Attorney, Agent, or Firm—James G. Morrow

[57] ABSTRACT

A mounting arrangement for an axial fan, wherein the axial fan is used for moving air through a cabinet or enclosure for heat generating electrical components. The axial fan is housed in a cylindrical housing having a flange and air inlet at one end and a flange and air outlet at the other end. The mounting arrangement also includes a support having a base with an air opening and two parallel walls. The parallel walls including catches for attaching the housing to the support. The support is mounted in an enclosure or formed as an integral part of the enclosure.

5 Claims, 1 Drawing Sheet

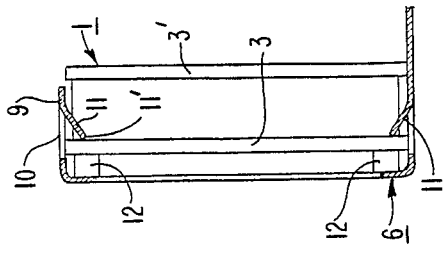
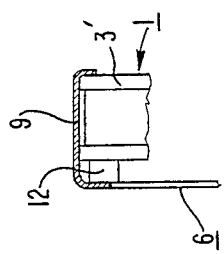
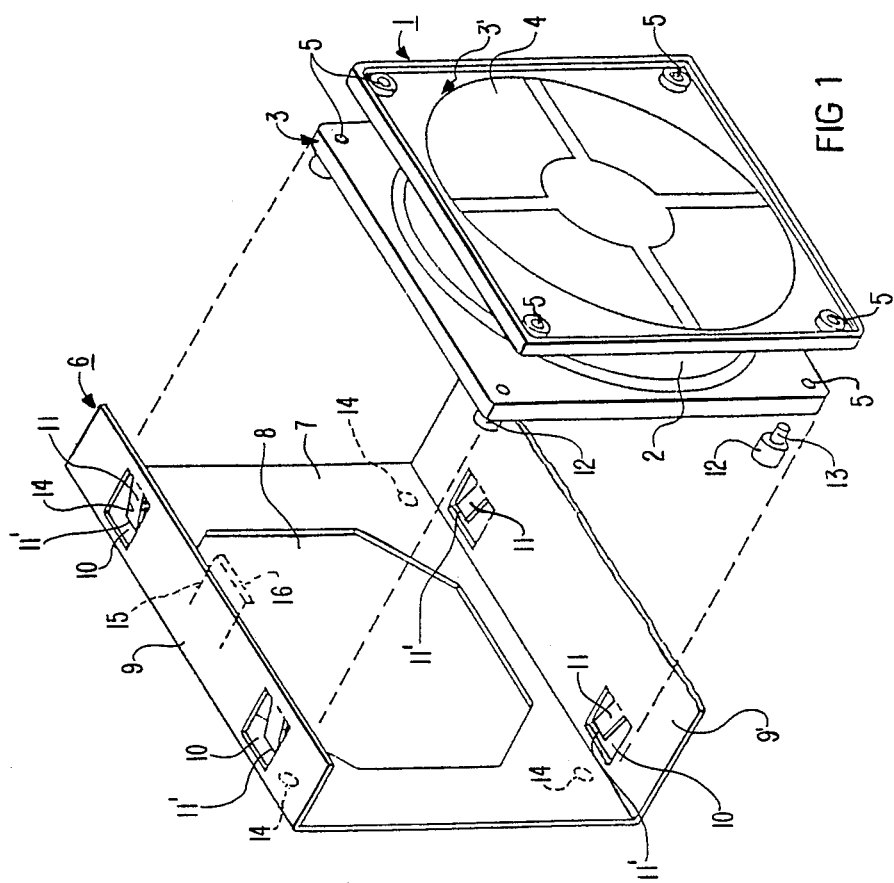

MOUNTING ARRANGEMENT FOR AN AXIAL FAN

BACKGROUND OF THE INVENTION

This invention relates to a mounting arrangement for an axial fan including a housing having mounting flanges.

In common mass-produced axial fans, the fan unit (fan wheel and motor drive) is placed in a cylindrical fan housing. A surface at one end of the cylindrical fan housing is provided with air-intake ports and flanges that can be bolted to a support. At the other end of the fan housing another similar surface is provided with air-exhaust ports and flanges that can be bolted to a support. In many cases, the support consists of a base plate or basal surface which is part of an enclosure for heat generating electrical components. Normally the base plate or basal surface includes an opening for the passage of air and tapped holes for mounting the fan housing.

Due to the compact design of cabinets or enclosures for electrical components, it is a problem to mount and demount a fan housing within these enclosures. Normally four bolts are required to mount the fan housing to the enclosure. The problem arises in that all of these bolts may not be accessible after the enclosure has been fully assembled with the electrical components, thus it is very difficult to replace a defective axial fan in an enclosure.

SUMMARY OF THE INVENTION

It is therefore, an object of the present invention to devise a fan mounting arrangement that will permit the mounting and demounting a fan housing without using bolting tools.

This and additional objects are attained by the present invention, wherein the preferred embodiment of the mounting arrangement for an axial fan includes a fan housing having a first flange and a second flange; a support having a substantially U-shaped cross-section and the support defining a base and two parallel side walls, the base including an opening for the passage of air; a plurality of catches for gripping the flanges of the fan housing, the catches extending from the side walls; and a plurality of axially spring-loaded spacers located between the base of the support and the flange located nearest to the base.

Various other objects and advantages of the present invention will become apparent from the following description, with reference to the accompanying drawings.

DESCRIPTION OF THE DRAWINGS

FIG. 1 illustrates a first embodiment of the mounting arrangement for an axial fan;

FIG. 2 illustrates a side view of the arrangement illustrated in FIG. 1; and

FIG. 3 illustrates a partial side view of a second embodiment of the mounting arrangement for an axial fan.

DETAILED DESCRIPTION OF THE PREFERRED EMBODIMENT OF THE INVENTION

Turning now to the drawings, FIG. 1 illustrates the fan housing 1 of an axial fan, wherein the fan unit (not shown) is arranged within the fan housing 1. The fan housing 1 includes a cylindrical mid-section 2, having air-intake ports and air-exhaust ports 4; a first flange 3; and a second flange 3'. The flanges 3, 3' include axially parallel and coaxially arranged bolt holes 5 in their corners. A support 6 for the axial fan is designed in the form of a flexible sheet metal part that is U-shaped in cross section. The support 6 includes a base 7, having an opening 8 for the passage of air, and two parallel side walls 9 and 9'. The parallel side walls have cut-outs 10 with inwardly flexible catches in the form of tongues 11.

In one embodiment of the invention, axially spring-loaded spacers 12 are disposed between the base 7 of the support 6 and the first flange 3 of the fan housing 1. The spacers 12 can also be designed as cylindrical elements made of elastic material and provided with plugs 13. The plugs 13 fit into the bolt holes 5 in the first flange 3 of the fan housing 1. In another embodiment of the invention, holes 14 may be provided in the base 7 of the support 6. The dotted lines in FIG. 1 illustrate the manner in which the plugs 13 of the spacers 12 may be inserted into the holes 14 such that they remain on the base 7 during the installation of the fan housing 1 onto the support 6.

The fan housing 1 and the support 6 are attached together by inserting the fan housing 1 between the parallel walls 9, 9' of the support 6. The fan housing 1 is inserted between the parallel walls 9, 9' such that the tongues 11 formed in the walls 9, 9' snap into a position such that the end portions 11' of the tongues 11 force the first flange 3 against the spring tension of the axially spring loaded spacers 12. (See FIGS. 2 and 3).

To remove the fan housing 1, the tongues 11 are bent outward into the planes defined by the parallel walls 9, 9' and the fan housing 1 is removed from the support 6. (To bend the tongues 11 outward an auxiliary means in the form of a narrow blade can be used.) The tongues 11 are subsequently bent inward such that they can hold a newly inserted fan housing 1 in place. The tongues 11 are manufactured so that the fan housing 1 can be removed and replace more than once.

In another embodiment of the claimed invention, catches in the form of tongues 15 can be used alone, or in conjunction with the tongues 11, to attach the fan housing 1 to the support 6. In FIG. 1 a tongue 15 extending from the parallel wall 9 is shown. The tongue 15 includes an inwardly bent end portion 16 for gripping the second flange 3' of the fan housing 1.

Depending on the size of the fan housing, the edge of one or both of the parallel walls 9, 9' may also be bent vertically to grip the second flange 3' of the fan housing 1. (See FIG. 3.)

While three embodiments of the mounting arrangement for an axial fan have been shown and described in detail herein, various other changes and modifications may be made without departing from the scope of the present invention.

I claim:

1. A mounting arrangement for a fan comprising:
   a fan housing including a first flange;
   a support having a substantially U-shaped cross-section, the support defining a base and two parallel side walls, the base including an opening for the passage of air;
   a plurality of catches for gripping the flange of the fan housing, the catches extending from the side walls; and
   a plurality of elastic spacers located between the base of the support and the flange.

2. The mounting arrangement of claim 1, wherein the catches comprise inwardly bendable tongues formed from cut-outs in the parallel walls, the tongues adapted to grip the flange.

3. The mounting arrangement of claim 1, wherein the spacers each include a plug on at least one of the spacer, wherein the plug is adapted to fit into a corresponding hole in the first flange.

4. The mounting arrangement of claim 1, wherein the spacers each include a plug on at least one end of the spacer, wherein the plug is adapted to fit into a corresponding hole in the base of the support.

5. A mounting arrangement for a fan comprising:
a fan housing including a first flange;
a support having a substantially U-shaped cross-section, the support defining a base and two parallel side walls, the base including an opening for the passage of air;
a plurality of catches for gripping the flange of the fan housing, the catches extending from the side walls, the catches comprising inwardly bendable tongues formed from cut-outs in the parallel walls, the tongues being adapted to grip the flange the catches further comprising tongues extending from the edges of the parallel side walls, wherein the housing includes a second flange and the tongues include inwardly bent end portions for gripping the second flange; and
a plurality of elastic spacers located between the base of the support and the flange.

* * * * *